(12) United States Patent
Akinaga et al.

(10) Patent No.: US 6,553,046 B2
(45) Date of Patent: Apr. 22, 2003

(54) HIGH-POWER SEMICONDUCTOR LASER DEVICE INCLUDING RESISTANCE REDUCTION LAYER WHICH HAS INTERMEDIATE ENERGY GAP

(75) Inventors: Fujio Akinaga, Kaisei-machi (JP); Toshiaki Fukunaga, Kaisei-machi (JP); Mitsugu Wada, Kaisei-machi (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 163 days.

(21) Appl. No.: 09/860,455

(22) Filed: May 21, 2001

(65) Prior Publication Data

US 2001/0043630 A1 Nov. 22, 2001

(30) Foreign Application Priority Data

May 19, 2000 (JP) ........................................ 2000-148165

(51) Int. Cl.⁷ ................................................. H01S 3/18
(52) U.S. Cl. .............................. 372/43; 372/44; 372/45; 372/50
(58) Field of Search ............................ 372/43, 46, 45, 372/50; 257/324; 438/481

(56) References Cited

U.S. PATENT DOCUMENTS

| | | | |
|---|---|---|---|
| 4,817,110 A | * 3/1989 | Tokuda et al. ................. | 372/46 |
| 5,640,409 A | * 6/1997 | Ito et al. ........................ | 372/45 |
| RE37,177 E | * 5/2001 | Ukita et al. .................... | 372/43 |
| 6,400,743 B1 | * 6/2002 | Fukunaga et al. ............. | 372/46 |
| 6,487,225 B2 | * 11/2002 | Okubo .......................... | 372/45 |

FOREIGN PATENT DOCUMENTS

JP 6-302910 10/1994 ............. H01S/3/18

* cited by examiner

*Primary Examiner*—Albert W. Paladini
(74) *Attorney, Agent, or Firm*—Sughrue Mion, PLLC

(57) ABSTRACT

In a semiconductor laser device, a lower cladding layer, a lower optical waveguide layer, an active layer, an upper optical waveguide layer, an upper cladding layer, and a contact layer are formed in this order on a GaAs substrate. The semiconductor laser device has at least one of first and second resistance reduction layers. The first resistance reduction layer is arranged between the substrate and the lower cladding layer, and made of an InGaAsP material having an energy gap which is greater than the energy gap of the substrate, and smaller than the energy gap of the lower cladding layer. The second resistance reduction layer is arranged between the upper cladding layer and the contact layer, and made of an InGaAsP material having an energy gap which is greater than the energy gap of the contact layer, and smaller than the energy gap of the upper cladding layer.

6 Claims, 4 Drawing Sheets

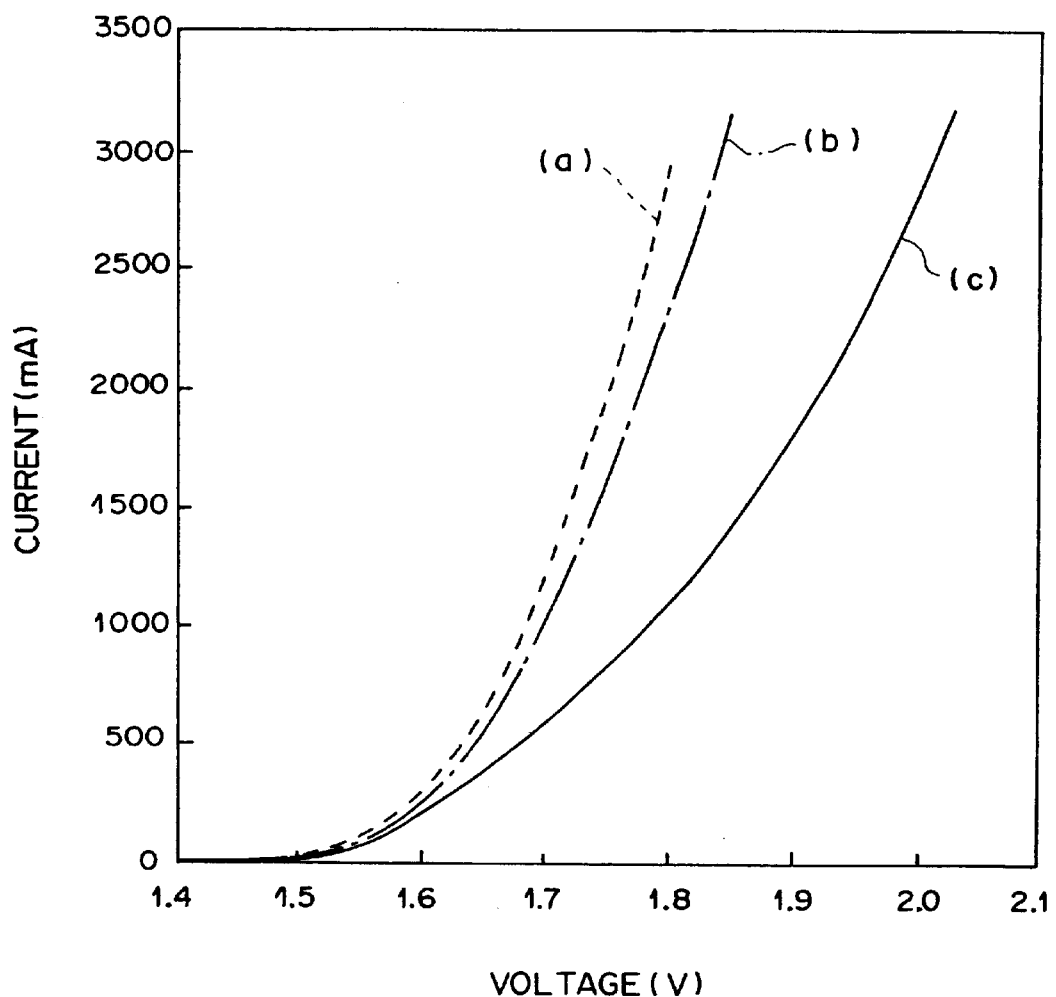

HIGH-POWER SEMICONDUCTOR LASER DEVICE INCLUDING RESISTANCE REDUCTION LAYER WHICH HAS INTERMEDIATE ENERGY GAP

BACKGROUND OF THE INVENTION

1. Field of the Invention

The present invention relates to a semiconductor laser device which is used in the fields of image processing, printing, medicine, and the like.

2. Description of the Related Art

Recently, high-power semiconductor laser devices are used in the fields of image processing, printing, medicine, and the like. The semiconductor laser devices used in those fields are required to operate with an output power of 1 W or higher and high reliability, and there are demands for increasing the output power of the semiconductor laser devices.

Generally, when a semiconductor laser device operates with an output power exceeding a certain level, non-radiative recombination occurs at the end facet, and the energy generated by the non-radiative recombination is absorbed by the crystal lattice, i.e., heat is generated. Since the temperature rise at the end facet decreases the energy gap, the light absorption is enhanced, and the temperature at the end facet is further raised. When the above cycle of operations is repeated, the so-called catastrophic optical mirror damage (COMD) occurs. Thus, the reliability of the semiconductor laser device in the high output power operation is impaired.

In particular, recombination centers are likely to be generated in AlGaAs-based semiconductor laser devices due to the inclusion of aluminum. Therefore, the AlGaAs-based semiconductor laser devices are prone to COMD, and not reliable in the high output power operation.

On the other hand, since recombination centers are not likely to be generated in InGaP-InGaAsP-based semiconductor laser devices, it is possible to increase the critical output power of the InGaP-InGaAsP-based semiconductor laser devices. However, electrical resistances at GaAs/InGaP hetero interfaces in the InGaP-InGaAsP-based semiconductor laser devices are great. Therefore, the characteristics of the InGaP-InGaAsP-based semiconductor laser devices are poor, and the reliability of the InGaP-InGaAsP-based semiconductor laser devices is low.

In order to solve the above problems, Japanese Unexamined Patent Publication (JPP) No. 6(1994)-302910 discloses a semiconductor laser device in which electrical resistance is reduced by using a graded-index type light-carrier-separate-confinement structure and unsymmetrically formed optical waveguide layers.

However, due to the miscibility gap, it is impossible to produce good-quality crystals in the manufacturing process of the semiconductor laser device disclosed by JPP No. 6(1994)-302910. Therefore, the electrical resistance of the entire semiconductor laser device cannot be effectively reduced. In addition, the electrical resistance can be reduced in only the vicinity of the active layer, and the electrical resistances at the interface between a GaAs substrate and a cladding layer and the interface between a contact layer and another cladding layer remain great. As a result, the electrical resistance of the entire semiconductor laser device cannot be sufficiently decreased.

SUMMARY OF THE INVENTION

The object of the present invention is to provide a semiconductor laser device which has low electrical resistance, and is reliable even when the semiconductor laser device operates with high output power.

According to the present invention, there is provided a semiconductor laser device comprising: a substrate made of a GaAs material having a first energy gap; a lower cladding layer formed on the substrate, and made of a material having a second energy gap; a lower optical waveguide layer formed on the lower cladding layer; an active layer formed on the lower optical waveguide layer; an upper optical waveguide layer formed on the active layer; an upper cladding layer formed on the upper optical waveguide layer, and made of a material having a third energy gap; and a contact layer formed on the upper cladding layer, and made of a material having a fourth energy gap. In addition, the semiconductor laser device comprises at least one of first and second resistance reduction layers, where the first resistance reduction layer is arranged between the substrate and the lower cladding layer, and made of an InGaAsP material having a fifth energy gap which is greater than the first energy gap, and smaller than the second energy gap, and the second resistance reduction layer is arranged between the upper cladding layer and the contact layer, and made of an InGaAsP material having a sixth energy gap which is greater than the fourth energy gap, and smaller than the third energy gap.

That is, according to the present invention, a resistance reduction layer is arranged between the substrate and the lower cladding layer and/or between the upper cladding layer and the contact layer, where the resistance reduction layer has an energy gap which is intermediate between the energy gaps of the layers located immediately above and below the resistance reduction layer. Thus, the difference in the energy gap between at least one pair of adjacent layers of the semiconductor laser device is reduced.

Specifically, each resistance reduction layer should have at least one energy gap which is intermediate between the energy gaps of the layers located immediately above and below the resistance reduction layer. In addition, each resistance reduction layer may have an energy gap which varies stepwise or gradually between the energy gaps of the layers located immediately above and below the resistance reduction layer. Further, each resistance reduction layer may be constituted by one or more sublayers.

According to the present invention, due to the provision of the resistance reduction layer, the energy gap varies stepwise or gradually between the layers located immediately above and below the resistance reduction layer. Therefore, the height of the potential barrier caused by a band offset between adjacent layers is reduced by the provision of the resistance reduction layer. Thus, the electrical resistance of the entire semiconductor laser device can be reduced. Due to the reduction of the electrical resistance of the semiconductor laser device, temperature rise in a high output power operation can be suppressed. Since the temperature rise can be suppressed, the facet degradation can also be suppressed. As a result, the critical output power and the lifetime of the semiconductor laser device increase.

In addition, generally, when the temperature of the semiconductor laser device rises, the oscillation wavelength is shifted to a longer wavelength side. Since the temperature rise can be suppressed according to the present invention, the wavelength shift due to the temperature rise can be reduced. Thus, the semiconductor laser device according to the present invention is reliable even in a high output power operation.

Preferably, the semiconductor laser device according to the present invention may also have one or any possible combination of the following additional features (i) to (v).

(i) Each of the lower cladding layer and the upper cladding layer is made of an aluminum-free material. In this case, generation of surface recombination centers at the end facet can be suppressed. Therefore, the reliability in the high output power operation can be further increased.

(ii) The lower optical waveguide has a seventh energy gap which is greater than the fifth energy gap. In this case, the electrical resistance of the entire semiconductor laser device can be further decreased.

(iii) The upper optical waveguide has an eighth energy gap which is greater than the sixth energy gap. In this case, the electrical resistance of the entire semiconductor laser device can be further decreased.

(iv) The lower cladding layer has a first carrier density, and the first resistance reduction layer has a second carrier density which is greater than the first carrier density. In this case, the electrical resistance of the entire semiconductor laser device can be further decreased.

(v) The upper cladding layer has a third carrier density, and the second resistance reduction layer has a fourth carrier density which is greater than the third carrier density. In this case, the electrical resistance of the entire semiconductor laser device can be further decreased.

DESCRIPTION OF THE DRAWINGS

FIG. 4 is a graph indicating a current-voltage characteristic of each of the semiconductor laser devices as the first and second embodiments and the conventional semiconductor laser device.

DESCRIPTION OF PREFERRED EMBODIMENTS

Embodiments of the present invention are explained in detail below with reference to drawings.

First Embodiment

Figure 1:
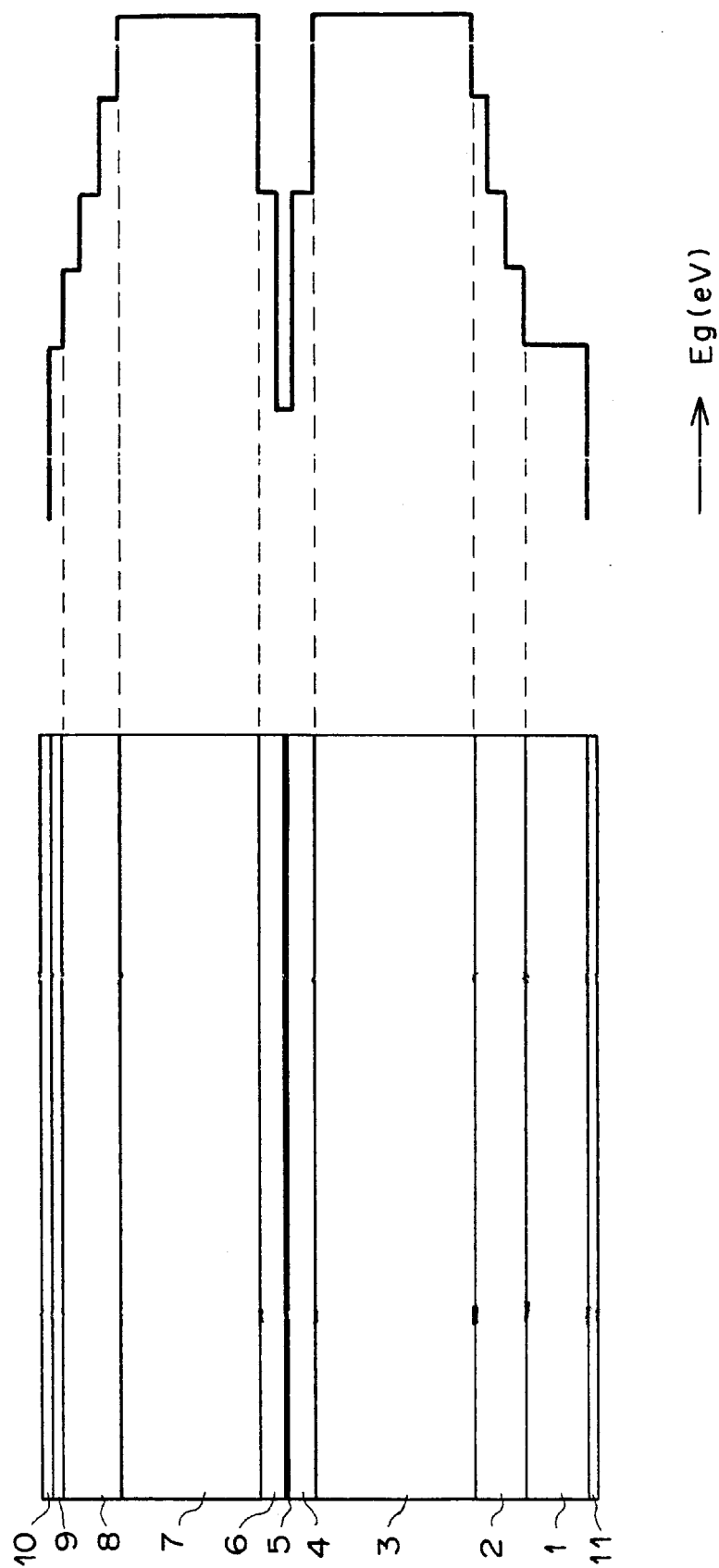
FIG. 1 is diagram indicating a cross-section of a semiconductor laser device as the first embodiment of the present invention and energy gaps of respective layers of the semiconductor laser device.

The left portion of FIG. 1 indicates a cross-section of a semiconductor laser device as the first embodiment of the present invention.

First, as illustrated in the left portion of FIG. 1, an n-type InGaAsP first resistance reduction layer 2 including three sublayers respectively having different energy gaps (Eg=1.50, 1.60, and 1.80 eV), an n-type InGaP lower cladding layer 3 having an energy gap (Eg=1.91 eV), an n-type or i-type InGaAsP lower optical waveguide layer 4 having an energy gap (Eg=1.60 eV), an InGaAs quantum well active layer 5 having an energy gap (Eg=1.27 eV), a p-type or i-type InGaAsP upper optical waveguide layer 6 having an energy gap (Eg=1.60 eV), a p-type InGaP upper cladding layer 7 having an energy gap (Eg=1.9 eV), a p-type InGaAsP second resistance reduction layer 8 including three sublayers respectively having different energy gaps (Eg=1.80, 1.60, and 1.50 eV), and a p-type GaAs contact layer 9 are formed on an n-type GaAs substrate 1 having an energy gap (Eg=1.42 eV) by organometallic vapor phase epitaxy. In the above construction, each of the InGaAsP first and second resistance reduction layers 2 and 8 and the InGaAsP lower and upper optical waveguide layers 4 and 6 has such a composition as to lattice-match with the n-type GaAs substrate 1.

In addition, a p electrode 10 is formed on the p-type GaAs contact layer 9. Further, the exposed surface of the substrate 1 is polished, and an n electrode 11 is formed on the polished surface of the substrate 1. Next, both end facets of the layered structure are cleaved, and a high reflectance coating and a low reflectance coating are provided on the respective end facets so as to form a resonator. Then, the above construction is formed into a semiconductor laser chip. In this example, the laser beam emitted from the semiconductor laser chip has a width of about 200 micrometers.

The right portion of FIG. 1 indicates the energy gaps of the respective layers of the above semiconductor laser device.

As illustrated in the right portion of FIG. 1, the n-type InGaAsP first resistance reduction layer 2, which is formed between the n-type GaAs substrate 1 and the n-type InGaP lower cladding layer 3, includes the three sublayers respectively having different energy gaps (Eg=1.50, 1.60, and 1.80 eV), and the three sublayers are arranged so that the energy gap of the n-type InGaAsP first resistance reduction layer 2 increases stepwise in the direction from the n-type GaAs substrate 1 to the n-type InGaP lower cladding layer 3. That is, the energy gap of the n-type InGaAsP first resistance reduction layer 2 varies stepwise between the energy gaps of the n-type GaAs substrate 1 and the n-type InGaP lower cladding layer 3.

In addition, the p-type InGaAsP second resistance reduction layer 8, which is formed between the p-type InGaP upper cladding layer 7 and the p-type GaAs contact layer 9, includes the three sublayers respectively having different energy gaps (Eg=1.80, 1.60, and 1.50 eV) so that the energy gap of the p-type InGaAsP second resistance reduction layer 8 decreases stepwise in the direction from the p-type InGaP upper cladding layer 7 to the p-type GaAs contact layer 9. That is, the energy gap of the p-type InGaAsP second resistance reduction layer 8 varies stepwise between the energy gaps of the p-type InGaP upper cladding layer 7 and the p-type GaAs contact layer 9.

Second Embodiment

Figure 2:
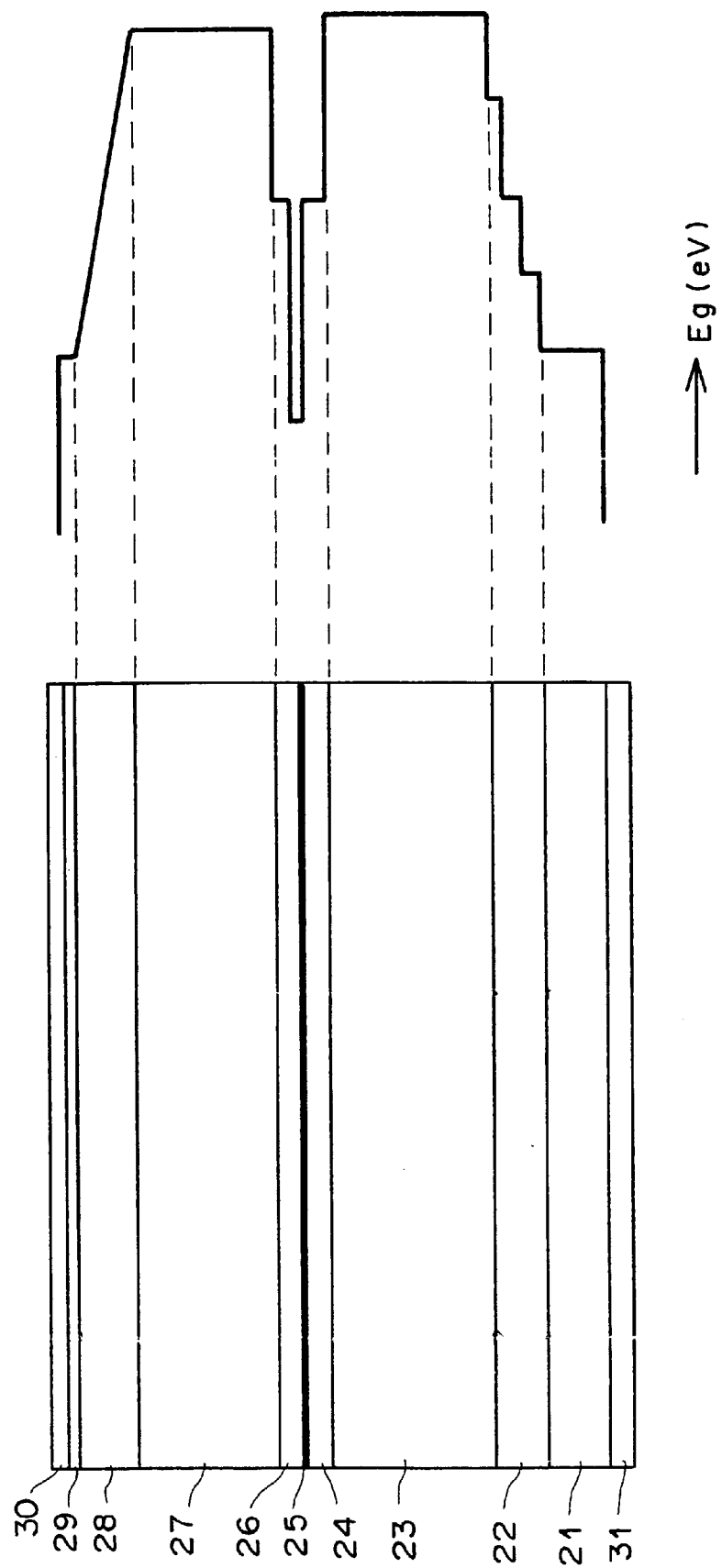
FIG. 2 is a diagram indicating a cross-section of a semiconductor laser device as the second embodiment of the present invention and energy gaps of respective layers of the semiconductor laser device.

The left portion of FIG. 2 indicates a cross-section of a semiconductor laser device as the second embodiment of the present invention.

First, as illustrated in the left portion of FIG. 2, an n-type InGaAsP first resistance reduction layer 22 including three sublayers respectively having different energy gaps (Eg=1.50, 1.60, and 1.80 eV), an n-type InGaP lower cladding layer 23 having an energy gap (Eg=1.91 eV), an n-type or i-type InGaAsP lower optical waveguide layer 24 having an energy gap (Eg=1.60 eV), an InGaAs quantum well active layer 25 having an energy gap (Eg=1.27 eV), a p-type or i-type InGaAsP upper optical waveguide layer 26 having an energy gap (Eg=1.60 eV), a p-type AlGaAs upper cladding layer 27 having an energy gap (Eg=1.8 eV), a p-type InGaAsP energy-gap-gradient resistance reduction layer 28 as a second resistance reduction layer having a energy gap (Eg) which gradually varies between 1.80 and 1.50 eV, and a p-type GaAs contact layer 29 are formed on an n-type GaAs substrate 21 having an energy gap (Eg=1.42 eV) by organometallic vapor phase epitaxy. In the above construction, each of the InGaAsP first and second resistance reduction layers 22 and 28 and the InGaAsP lower and upper optical waveguide layers 24 and 26 has such a composition as to lattice-match with the n-type GaAs substrate 21.

In addition, a p electrode 30 is formed on the p-type GaAs contact layer 29. Further, the exposed surface of the substrate 21 is polished, and an n electrode 31 is formed on the polished surface of the substrate 21. Next, both end facets of the layered structure are cleaved, and a high reflectance coating and a low reflectance coating are provided on the respective end facets so as to form a resonator. Then, the above construction is formed into a semiconductor laser chip. In this example, the laser beam emitted from the semiconductor laser chip has a width of about 200 micrometers.

The right portion of FIG. 2 indicates the energy gaps of the respective layers of the above semiconductor laser device.

As illustrated in the right portion of FIG. 2, the n-type InGaAsP first resistance reduction layer 22, which is formed between the n-type GaAs substrate 21 and the n-type InGaP lower cladding layer 23, includes the three sublayers respectively having different energy gaps (Eg=1.50, 1.60, and 1.80 eV), and the three sublayers are arranged so that the energy gap of the n-type InGaAsP first resistance reduction layer 22 increases stepwise in the direction from the n-type GaAs substrate 21 to the n-type InGaP lower cladding layer 23. That is, the energy gap of the n-type InGaAsP first resistance reduction layer 22 varies stepwise between the energy gaps of the n-type GaAs substrate 21 and the n-type InGaP lower cladding layer 23.

In addition, the energy gap of the p-type InGaAsP energy-gap-gradient resistance reduction layer 28 continuously decreases from the energy gap (Eg=1.80 eV) of the p-type AlGaAs upper cladding layer 27 to the energy gap (Eg=1.50 eV) of the p-type GaAs contact layer 29.

Comparison with Conventional Device

Figure 3:
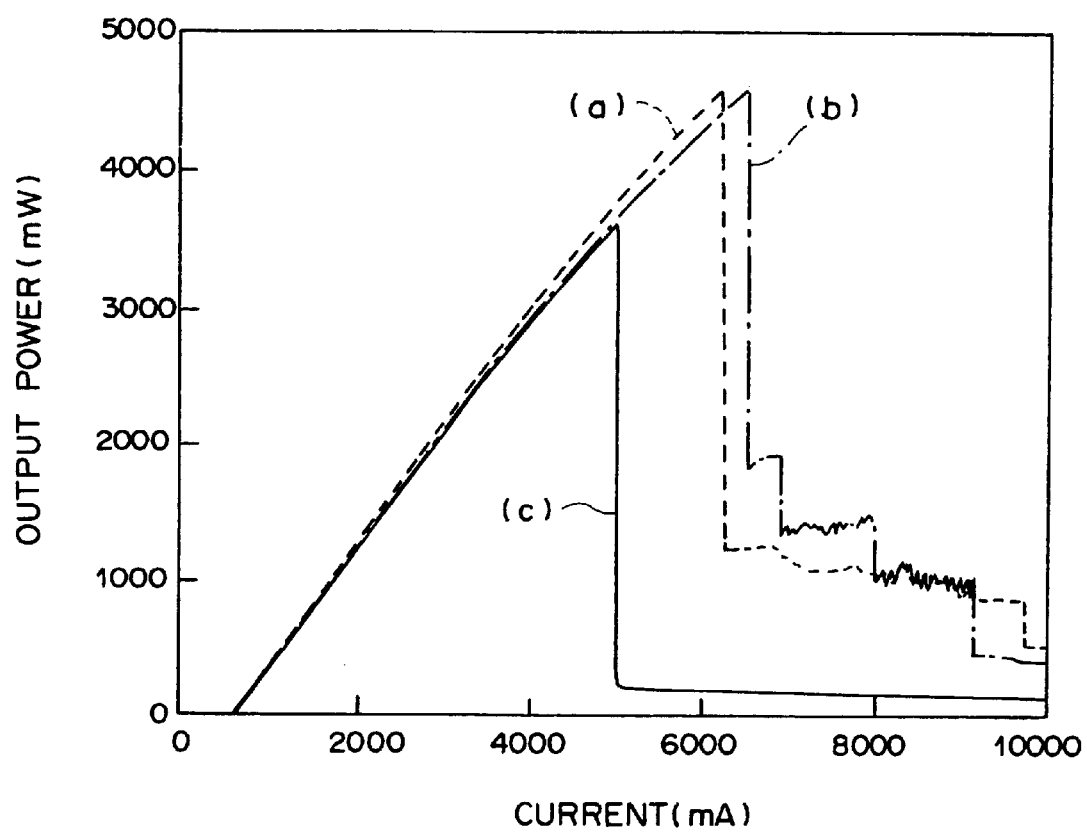
FIG. 3 is a graph indicating a current-optical output characteristic of the semiconductor laser devices as the first and second embodiments and the conventional semiconductor laser device.

FIG. 3 is a graph indicating a current-optical output characteristic of each of the semiconductor laser devices as the first and second embodiments and the conventional semiconductor laser device, and FIG. 4 is a graph indicating a current-voltage characteristic of each of the semiconductor laser devices as the first and second embodiments and the conventional semiconductor laser device. In each of FIGS. 3 and 4, the dashed lines (a) indicate the current-optical output or current-voltage characteristic of the semiconductor laser device as the first embodiment, the alternate long and short dash lines (b) indicate the current-optical output or current-voltage characteristic of the semiconductor laser device as the second embodiment, and the solid lines (c) indicate the current-optical output or current-voltage characteristic of the conventional semiconductor laser device.

As indicated in FIG. 3, the maximum optical output power of each of the semiconductor laser devices as the first and second embodiments is greater than the maximum optical output power of the conventional semiconductor laser device. This is considered to be a result of the fact that the semiconductor laser device according to the present invention is less prone to facet degradation than the conventional semiconductor laser device.

As indicated in FIG. 4, the current-voltage characteristic curve of each of the semiconductor laser devices as the first and second embodiments rises faster than the current-voltage characteristic curve of the conventional semiconductor laser device. That is, the current which flows corresponding to each voltage value in each of the semiconductor laser devices as the first and second embodiments is greater than the current which flows corresponding to the same voltage value in the conventional semiconductor laser device. This is considered to be a result of the fact that the electrical resistance of the semiconductor laser device according to the present invention is lower than the electrical resistance of the conventional semiconductor laser device.

As described above, the semiconductor laser device according to the present invention exhibits lower electrical resistance than the conventional semiconductor laser device, and superior to the conventional semiconductor laser device in the output power and reliability.

Additional Matters (i) In the first and second embodiments, each resistance reduction layer includes three sublayers having different energy gaps, or has an energy gap which varies gradually. However, as an alternative, each resistance reduction layer may have only one energy gap which is intermediate between the energy gaps of the layers located immediately above and below the resistance reduction layer. Further, as a second alternative, each resistance reduction layer may have an energy gap which varies stepwise or gradually between the energy gaps of the layers located immediately above and below the resistance reduction layer. Further, each resistance reduction layer may be constituted by one, two, four, or more sublayers. When a resistance reduction layer is constituted by a plurality of sublayers, the plurality of sublayers are arranged so that the energy gap of the resistance reduction layer increases or decreases stepwise between layers located immediately above and below the resistance reduction layer.

(ii) In each of the first and second embodiments, a resistance reduction layer is arranged in each of the n-type and p-type portions of the semiconductor laser device. However, as an alternative, a resistance reduction layer may be arranged in only one of the n-type and p-type portions of the semiconductor laser device. In this case, the advantage of the present invention can also be obtained.

(iii) Although the electrodes are formed on the substantially entire surfaces of the construction of the first and second embodiments, the present invention can be applied to gain-guided stripe-type semiconductor laser devices, or index-guided semiconductor laser devices, or semiconductor laser devices having a diffraction grating. Further, the present invention can also be applied to semiconductor laser devices formed in integrated circuits.

(iv) Although n-type GaAs substrates are used in the constructions of the first and second embodiments, instead, p-type GaAs substrates may be used. When the GaAs substrates are a p-type, the conductivity types of all of the other layers in the constructions of the first and second embodiments should be inverted.

(v) The active layer in the semiconductor laser device according to the present invention may include multiple quantum wells. In addition, the active layer in the semiconductor laser device according to the present invention may be made of a material having a compressive strain.

What is claimed is:

1. A semiconductor laser device comprising:

a substrate made of a GaAs material having a first energy gap;

a lower cladding layer formed on said substrate, and made of a material having a second energy gap;

a lower optical waveguide layer formed on said lower cladding layer;

an active layer formed on said lower optical waveguide layer;

an upper optical waveguide layer formed on said active layer;

an upper cladding layer formed on said upper optical waveguide layer, and made of a material having a third energy gap;

a contact layer formed on said upper cladding layer, and made of a material having a fourth energy gap; and at least one of first and second resistance reduction layers, where said first resistance reduction layer is arranged between said substrate and said lower cladding layer, and made of an InGaAsP material having a fifth energy gap which is greater than said first energy gap, and smaller than said second energy gap, and said second resistance reduction layer is arranged between said upper cladding layer and said contact layer, and made of an InGaAsP material having a sixth energy gap which is greater than said fourth energy gap, and smaller than said third energy gap.

2. A semiconductor laser device according to claim 1, wherein each of said lower cladding layer and said upper cladding layer is made of an aluminum-free material.

3. A semiconductor laser device according to claim 1, wherein said lower optical waveguide has a seventh energy gap which is greater than said fifth energy gap.

4. A semiconductor laser device according to claim 1, wherein said upper optical waveguide has an eighth energy gap which is greater than said sixth energy gap.

5. A semiconductor laser device according to claim 1, wherein said lower cladding layer has a first carrier density, and said first resistance reduction layer has a second carrier density which is greater than said first carrier density.

6. A semiconductor laser device according to claim 1, wherein said upper cladding layer has a third carrier density, and said second resistance reduction layer has a fourth carrier density which is greater than said third carrier density.

* * * * *